(12) United States Patent
Tan et al.

(10) Patent No.: US 6,806,740 B1
(45) Date of Patent: Oct. 19, 2004

(54) REDUCED COMPLEXITY LINEAR PHASE DETECTOR

(75) Inventors: Mehmet Ali Tan, Irvine, CA (US); Daniel Chan, Huntington Beach, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/452,661

(22) Filed: May 30, 2003

(51) Int. Cl.[7] .............................................. H03D 9/00
(52) U.S. Cl. ........................................... 327/2; 327/12
(58) Field of Search ...................................... 327/2–12

(56) References Cited

U.S. PATENT DOCUMENTS 5,027,085 A * 6/1991 DeVito ....................... 331/1 A
6,463,109 B1 * 10/2002 McCormack et al. ....... 375/355
6,590,426 B2 * 7/2003 Perrott ........................... 327/7

FOREIGN PATENT DOCUMENTS

WO          WO 9845949 A1 * 10/1998 ........... H03L/7/085

OTHER PUBLICATIONS

M. Burzio et al., "A High Speed 0.7$\mu$m CMOS PLL Circuit for Clock/Data Recovery in Interconnection Systems," ESSCIRC, '96 Proceedings of the 22nd European Solid–State Circuits Conference, 4 pages, 1996.

C.R. Hogge, "A Self Correcting Clock Recovery Circuit," IEEE Journal of Lightwave Technology, vol. LT–3, pp. 1312–1314, Dec. 1985.

Y. Tang et al., "A Non–sequential Phase Detector for PLL–based High–Speed Data/Clock Recovery," Proceedings of 2000 Midwest Symposium on Circuits and Systems, pp. 428–431, Aug. 2000.

* cited by examiner

*Primary Examiner*—Timothy P. Callahan
*Assistant Examiner*—Cassandra Cox

(57) ABSTRACT

A linear phase detector includes first, second and third latches connected in series, each of the latches having a data input, a data output and a clock input, and further includes reference signal generation circuitry and error signal generation circuitry. The reference signal generation circuitry has at least a first input coupled to the data output of the second latch and a second input coupled to the data output of the third latch. The error signal generation circuitry has at least a first input coupled to the data input of the first latch and a second input coupled to the data output of the second latch, and is configured to generate an output that is indicative, relative to the reference signal, of the phase error of a clock signal. The linear phase detector is preferably configured such that a first version of the clock signal is applied to the clock inputs of the first and third latches, and a second version of the clock signal is applied to the clock input of the second latch, the first and second versions being complementary relative to one another. The linear phase detector in an illustrative embodiment exhibits a linearity substantially equivalent to that associated with a conventional four-latch Hogge detector.

17 Claims, 3 Drawing Sheets

REDUCED COMPLEXITY LINEAR PHASE DETECTOR

FIELD OF THE INVENTION

The present invention relates generally to electronic circuits, and more particularly to linear phase detectors.

BACKGROUND OF THE INVENTION

Linear phase detectors are commonly utilized in phase-locked loops (PLLs) and other types of clock recovery circuits. Such clock recovery circuits may be implemented in integrated circuits used in a wide variety of electronic systems, including communication systems, interconnection systems and data storage systems.

A well-known type of conventional linear phase detector is the so-called Hogge detector, described in C. R. Hogge, "A Self-Correcting Clock Recovery Circuit," IEEE Journal of Lightwave Technology, Vol. LT-3, pp. 1312–1314, December 1985, which is incorporated by reference herein. Such a detector generally comprises a pair of flip-flops connected in series and a pair of two-input exclusive-or (XOR) gates, with each of the XOR gates receiving as its two inputs the input and output of a corresponding one of the flip-flops.

An example of a Hogge detector configured for use in a PLL for clock and data recovery in a high speed optical-electrical interconnection system is described in M. Burzio et al., "A high speed 0.7 μm CMOS PLL circuit for clock/data recovery in interconnection systems," ESSCIRC '96 Proceedings of the 22nd European Solid-State Circuits Conference, which is incorporated by reference herein.

Conventional Hogge detectors such as those described in the above-cited references suffer from a significant drawback in that these detectors generally include at least two flip-flops that are formed using a total of four latch circuits. This results in undue circuit complexity and power consumption, particularly in integrated circuit applications which may involve many such linear phase detectors.

Other phase detector circuits known in the art are configured to eliminate the use of flip-flops altogether. For example, a phase detector that utilizes delay cells implemented by inverters, and includes no flip-flops, is described in Y. Tang et al., "A non-sequential phase detector for PLL-based high-speed data/clock recovery," Proceedings of 2000 Midwest Symposium on Circuits and Systems, pp. 428–431, August 2000, which is incorporated by reference herein. However, the problem with these alternative phase detector circuits is that they fail to provide the advantageous linearity commonly associated with the Hogge detector.

A need therefore exists for an improved phase detector which exhibits substantially reduced circuit complexity and power consumption relative to the above-described Hogge detector, while also maintaining similar linearity.

SUMMARY OF THE INVENTION

The present invention provides an improved linear phase detector which in an illustrative embodiment addresses the above-noted need.

In accordance with one aspect of the invention, a linear phase detector includes first, second and third latches connected in series, each of the latches having a data input, a data output and a clock input. The linear phase detector further includes reference signal generation circuitry and error signal generation circuitry. The reference signal generation circuitry has at least a first input coupled to the data output of the second latch and a second input coupled to the data output of the third latch. The error signal generation circuitry has at least a first input coupled to the data input of the first latch and a second input coupled to the data output of the second latch, and is configured to generate an output that is indicative, relative to the reference signal, of phase error of a clock signal.

The linear phase detector is preferably configured such that a first version of the clock signal is applied to the clock inputs of the first and third latches, and a second version of the clock signal is applied to the clock input of the second latch, the first and second versions being complementary relative to one another.

In the illustrative embodiment, the error signal generation circuitry is configured to generate an output error signal comprising one or more pulses each having a pulse width that, relative to a corresponding pulse of the reference signal, is indicative of the phase error of the clock signal. More specifically, the pulse width of a given pulse of the error signal being greater than that of a corresponding pulse of the reference signal indicates a late clock signal condition, the pulse width of the given pulse of the error signal being less than that of the corresponding pulse of the reference signal indicates an early clock signal condition, and the pulse width of the given pulse of the error signal being substantially equal to that of the corresponding pulse of the reference signal indicates a substantially zero phase error condition.

The linear phase detector may be implemented, for example, as a component of a clock recovery circuit, which may be in the form of a portion of an integrated circuit, or in other applications.

Advantageously, a linear phase detector in the illustrative embodiment includes a total of only three latches, and thus exhibits reduced circuit complexity and power consumption relative to the conventional four-latch Hogge detector. Moreover, this illustrative linear phase detector provides substantially the same linearity as the conventional four-latch Hogge detector. Utilization of linear phase detectors in accordance with the present invention can therefore save both area and power in integrated circuit applications.

DETAILED DESCRIPTION OF THE INVENTION

The present invention will be illustrated below in conjunction with an exemplary embodiment of a linear phase detector which exhibits reduced complexity and power consumption relative to a conventional Hogge detector but provides similar linearity. It should be understood, however, that the invention is not limited to use with the particular circuitry arrangements of the illustrative embodiment.

Figure 1:
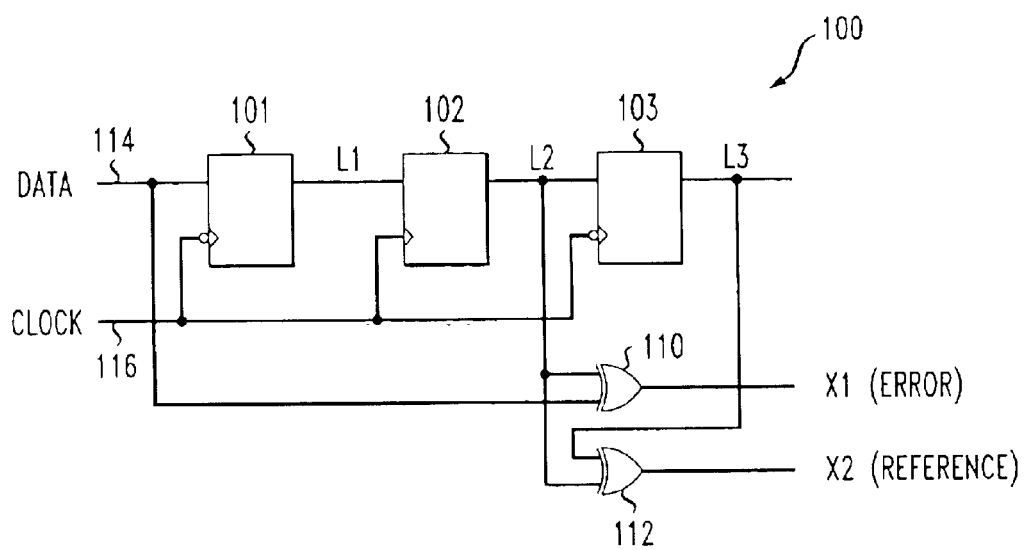
FIG. 1 is a schematic diagram of a linear phase detector in accordance with an illustrative embodiment of the invention.

FIG. 1 shows a linear phase detector 100, also referred to herein as a linear phase detector circuit or simply a phase detector circuit, in accordance with an illustrative embodiment of the present invention. The circuit 100 is referred to as a "linear" phase detector in that it exhibits a linearity substantially equivalent to that associated with a conventional four-latch Hogge detector of the type previously described herein. However, an advantage of the circuit 100 is that it provides significantly reduced circuit complexity and power consumption relative to the conventional four-latch Hogge detector.

The linear phase detector 100 includes first, second and third latches, denoted 101, 102 and 103, respectively, connected in series. Each of the latches 101, 102 and 103 includes a data input, a data output and a clock input. The data output of the first latch 101 is coupled to the data input of the second latch 102. The data output of the second latch 102 is coupled to the data input of the third latch 103.

The outputs of the first, second and third latches 101, 102 and 103 are denoted herein as L1, L2 and L3, respectively.

The linear phase detector is configured such that a first version of the clock signal is applied to the clock inputs of the first latch 101 and the third latch 103, and a second version of the clock signal is applied to the clock input of the second latch 102, with the first and second versions being complementary relative to one another. More specifically, in this particular embodiment the clock is fed to the first latch 101 and the third latch 103 in inverted form, and is fed to the second latch 102 in non-inverted form. Other clocking arrangements may be used in alternative embodiments of the invention.

Also included in the linear phase detector 100 is error signal generation circuitry having at least a first input coupled to the data input of the first latch 101 and a second input coupled to the data output of the second latch 102. The error signal generation circuitry is configured to generate an output indicative of phase error of a clock signal, and in this illustrative embodiment is implemented as a two-input exclusive-or (XOR) gate 110. Those skilled in the art will recognize that numerous alternative arrangements of error signal generation circuitry may be used to generate an output indicative of phase error of a clock signal. The output of the XOR gate 110 is an error signal denoted X1 herein.

The linear phase detector 100 further comprises reference signal generation circuitry having at least a first input coupled to the data output of the second latch 102 and a second input coupled to the data output of the third latch 103. The reference signal generation circuitry is configured to generate an output corresponding to a reference signal, and in this illustrative embodiment is implemented as a two-input XOR gate 112, although numerous other circuitry arrangements can be used. The output of the XOR gate 112 is a reference signal denoted X2 herein.

In operation, the linear phase detector 100 receives a data signal via signal line 114 and a clock signal via signal line 116. The error signal X1 is indicative of the phase error of the clock signal. More specifically, the error signal X1 comprises one or more pulses each having a pulse width that, relative to a corresponding pulse of the reference signal X2, is indicative of the phase error of the clock signal.

An example of the manner in which the relative pulse widths of the error signal and reference signal pulses may be used to determine clock phase error will now be described with reference to the timing diagrams of FIGS. 2, 3 and 4. It is to be appreciated that many other techniques may be used to process error signal and reference signal pulses to determines phase error in a linear phase detector in accordance with the invention.

Figure 2:
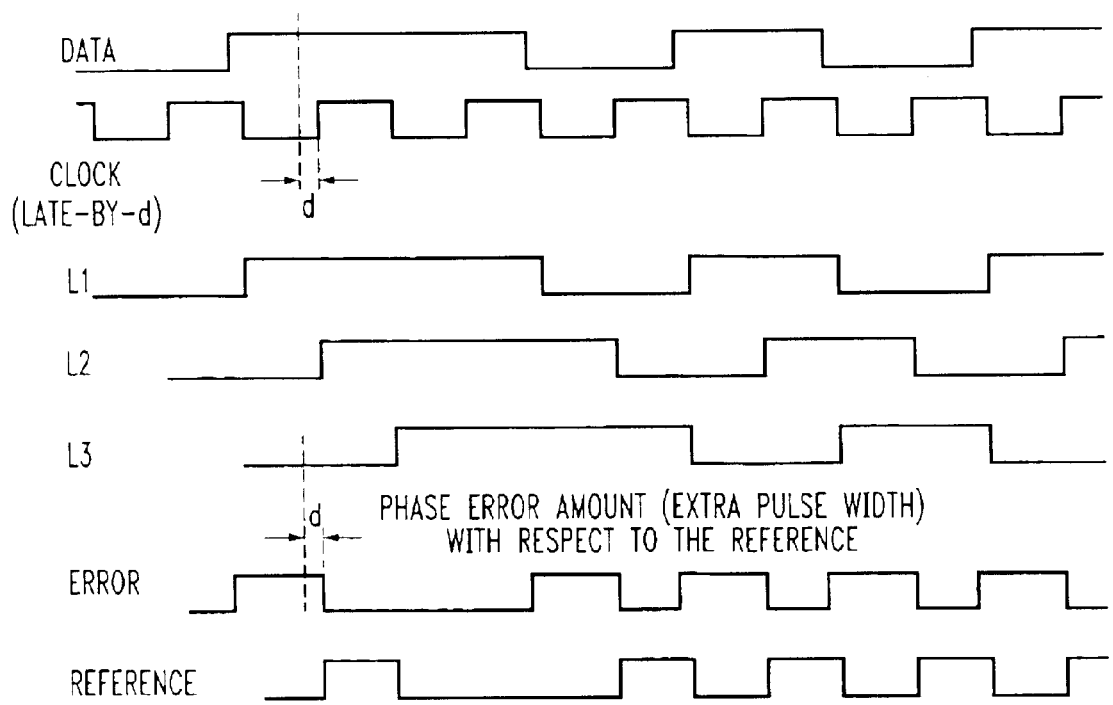
FIG. 2 is a timing diagram illustrating the operation of the FIG. 1 linear phase detector for a late clock signal condition.

Referring initially to the timing diagram of FIG. 2, an example of a late clock signal condition is shown. The FIG. 2 timing diagram shows data, clock, L1, L2, L3, error and reference signals for a situation in which the clock signal is late relative to the data signal by an amount denoted as d. This exemplary late clock signal condition is reflected in the duration of the pulse widths of the positive error signal pulses relative to corresponding pulse widths of the positive reference signal pulses. More specifically, each of one or more of the positive pulses of the error signal has a duration which is longer than that of the corresponding positive pulse of the reference signal by approximately the amount d.

Figure 3:
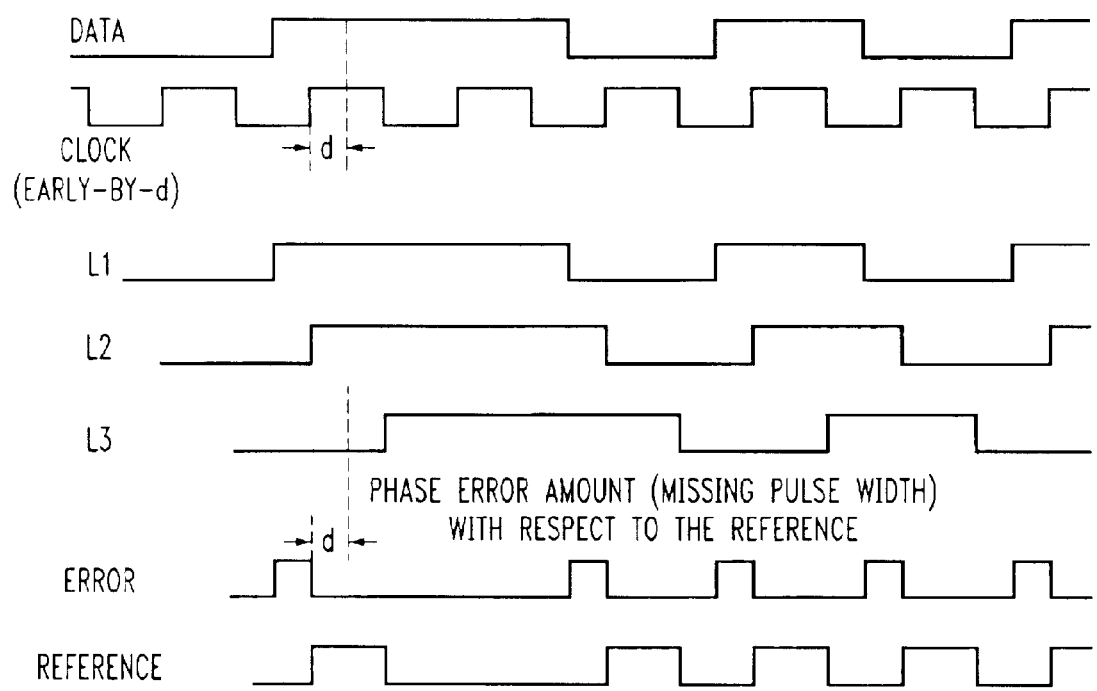
FIG. 3 is a timing diagram illustrating the operation of the FIG. 1 linear phase detector for an early clock signal condition.
Figure 4:
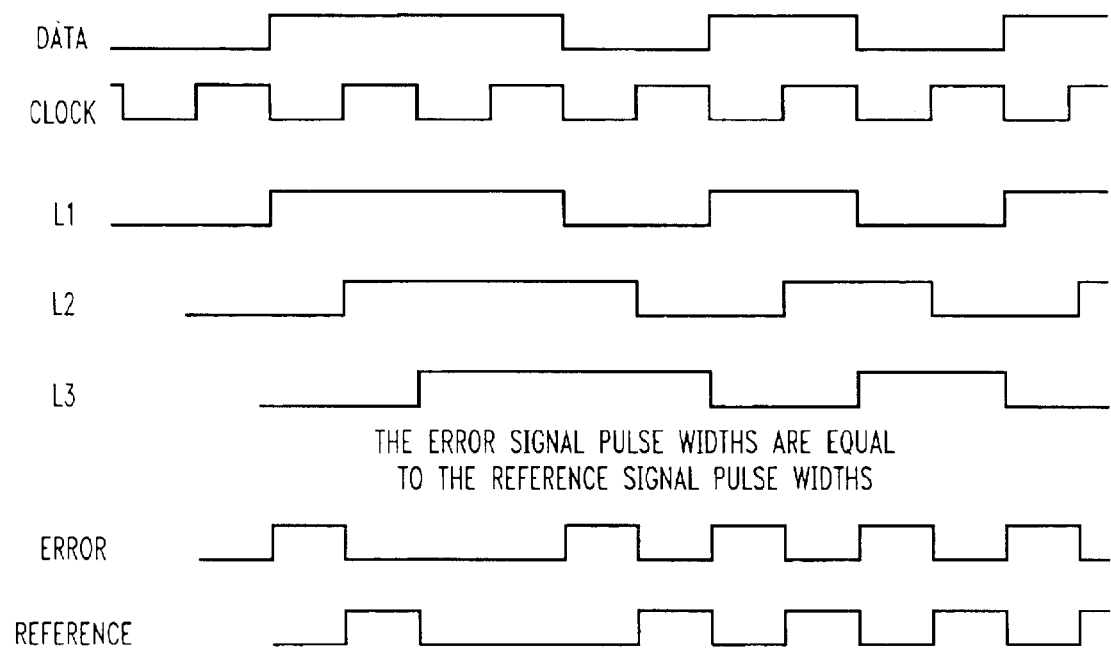
FIG. 4 is a timing diagram illustrating the operation of the FIG. 1 linear phase detector for a zero phase error condition.

The term "corresponding pulse" as used herein with reference to the timing diagrams of FIGS. 2, 3 and 4 is intended to include, by way of example and without limitation, that pulse of the reference signal to which the given pulse of the error signal is compared in determining the presence of phase error. It may be the reference signal pulse that is nearest in time to the given pulse of the error signal, or any other reference signal pulse used for comparison purposes. Other pulse-based comparison arrangements may be used including, for example, arrangements based on sets of pulses of at least one of the error signal and the reference signal.

It should also be noted that, although the embodiment described in conjunction with the timing diagrams of FIGS. 2, 3 and 4 is based on comparison of positive pulses of the error and reference signals, other embodiments may utilize the negative pulses, in which case the late or early conclusions drawn from the results of the comparison will be complementary to those drawn in the positive pulse embodiment.

It is also apparent from the timing diagrams of FIGS. 2, 3 and 4 that the reference signal, after an initial interval, has an approximately 50% duty cycle for the example alternating 0, 1 data pattern of the data signal. However, this is not a requirement of the present invention, and other types of reference signals may be used in other embodiments of the invention.

Referring now to the timing diagram of FIG. 3, an example of an early clock signal condition is shown. The FIG. 3 timing diagram shows data, clock, L1, L2, L3, error and reference signals for a situation in which the clock signal is early relative to the data signal by the amount d. This exemplary early clock signal condition is reflected in the duration of the pulse widths of the positive error signal pulses relative to corresponding pulse widths of the positive reference signal pulses.

More specifically, each of one or more of the positive pulses of the error signal has a duration which is shorter than that of the corresponding pulse of the reference signal by approximately the amount d.

An example of a zero phase error condition is illustrated in the timing diagram of FIG. 4, which shows data, clock, L1, L2, L3, error and reference signals for a situation in which the clock signal is neither late nor early relative to the data signal. This exemplary zero phase error condition is reflected in the duration of the pulse widths of the positive error signal pulses relative to corresponding pulse widths of the positive reference signal pulses. More specifically, each of one or more of the positive pulses of the error signal has a duration which is substantially the same as that of the corresponding pulse of the reference signal.

In this embodiment, when the zero phase error condition is achieved, the error signal and reference signal have substantially the same waveform, but the error signal leads the reference signal by one-half of a clock cycle, as is shown in FIG. 4. It can be seen from the figure that, after an initial interval, both the error signal and the reference signal have an approximately 50% duty cycle in the case of the zero phase error condition, for the example alternating 0, 1 data pattern of the data signal.

It is also apparent from the FIG. 4 timing diagram that the linear phase detector in the illustrative embodiment has the advantage of being self-correcting. More specifically, the positive or rising edge of the clock signal under the zero phase error condition is substantially centered within a given bit of the data signal, as desired for optimal timing. Other arrangements may provide a desired timing with respective to other clock edges, as in an arrangement involving negative or falling edge triggered circuitry.

The linear phase detector 100 of FIG. 1 may be implemented, by way of example, as a component of an integrated circuit for use in a communication system, an interconnection system a data storage system or other application. Such an integrated circuit may include many such linear phase detectors, utilized in clock recovery circuits or other types of circuitry.

Figure 5:
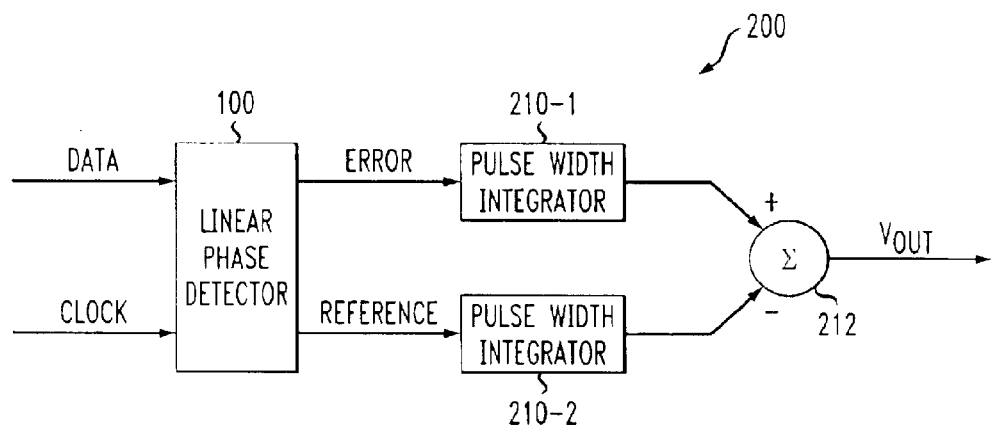
FIG. 5 shows a portion of an example clock recovery circuit which includes the linear phase detector of FIG. 1.

FIG. 5 shows a portion of an example clock recovery circuit 200 in which the linear phase detector is implemented. The clock recovery circuit 200 includes the linear phase detector 100 as previously described. The error and reference signal outputs of the linear phase detector 100 are coupled to respective pulse width integrators 210-1 and 210-2. Each of the pulse width integrators may comprise, for example, a conventional charge pump, active filter, or other similar conventional circuit. A signal combiner 212 is configured to subtract the output of the reference signal pulse width integrator 210-2 from that of the error signal pulse width integrator 210-1. The output of the signal combiner 212 is a voltage $V_{OUT}$ which is proportional to the determined phase error of the clock signal.

The voltage $V_{OUT}$ may be applied as a control input to a voltage-controlled oscillator (VCO) or other similar element in a PLL designed to maintain a desired phase relationship between the clock and data signals, as will be readily appreciated by those skilled in the art.

The particular clock recovery circuit shown in FIG. 5 is merely one possible example of a clock recovery circuit in which the linear phase detector 100 can be implemented.

Advantageously, the linear phase detector 100 of FIG. 1 includes a total of only three latches, and thus exhibits reduced circuit complexity and power consumption relative to the conventional four-latch Hogge detector. Moreover, the linear phase detector 100 provides substantially the same linearity as the conventional four-latch Hogge detector. Utilization of linear phase detectors in accordance with the present invention can therefore save both area and power in integrated circuit applications.

It should again be emphasized that the exemplary linear phase detector shown in FIG. 1 is intended to illustrate the operation of the invention, and therefore should not be construed as limiting the invention to any particular embodiment or group of embodiments. Furthermore, it will be apparent to those skilled in the art that the particular linear phase detector shown herein for purposes of illustrating (he invention may be implemented in many different ways, and may include additional or alternative elements. For example, other types of error signal generation circuitry and reference signal generation circuitry may be used. As another example, the format, timing and other characteristics of the error signal or reference signal may be altered. In addition, a variety of different techniques for processing the error and reference signals to determine clock signal phase error may be used.

These and numerous other alternative embodiments within the scope of the following claims will therefore be apparent to those skilled in the art.

What is claimed is:

1. A phase detector circuit comprising:

first, second and third latches connected in series, each of the latches having a data input, a data output and a clock input, the data output of the first latch being coupled to the data input of the second latch, the data output of the second latch being coupled to the data input of the third latch;

reference signal generation circuitry having at least a first input coupled to the data output of the second latch and a second input coupled to the data output of the third latch, the reference signal generation circuitry being configured to generate an output corresponding to a reference signal; and error signal generation circuitry having at least a first input coupled to the data input of the first latch and a second input coupled to the data output of the second latch, the error signal generation circuitry being configured to generate an output that is indicative, relative to the reference signal, of phase error of a clock signal.

2. The phase detector circuit of claim 1 wherein said circuit exhibits a linearity substantially equivalent to that associated with a four-latch Hogge detector.

3. The phase detector circuit of claim 1 wherein a first version of the clock signal is applied to the clock inputs of the first and third latches, and a second version of the clock signal is applied to the clock input of the second latch, the first and second versions being complementary relative to one another.

4. The phase detector circuit of claim 1 wherein the reference signal generation circuitry comprises a two-input exclusive-or gate.

5. The phase detector circuit of claim 1 wherein the error signal generation circuitry comprises a two-input exclusive-or gate.

6. The phase detector circuit of claim 1 wherein the error signal generation circuitry is configured to generate an output error signal comprising a plurality of pulses each having a pulse width that, relative to a corresponding pulse of the reference signal, is indicative of the phase error of the clock signal.

7. The phase detector circuit of claim 1 wherein the error signal generation circuitry is configured to generate an output comprising an error signal.

8. The phase detector circuit of claim 7 wherein a given pulse of the error signal has a pulse width that is indicative, relative to a corresponding pulse of the reference signal, of the phase error of the clock signal.

9. The phase detector circuit of claim 8 wherein the pulse width of the given pulse of the error signal being greater than that of the corresponding pulse of the reference signal indicates a late clock signal condition.

10. The phase detector circuit of claim 8 wherein the pulse width of the given pulse of the error signal being less than that of the corresponding pulse of the reference signal indicates an early clock signal condition.

11. The phase detector circuit of claim 8 wherein the pulse width of the given pulse of the error signal being substantially equal to that of the corresponding pulse of the reference signal indicates a substantially zero phase error condition.

12. The phase detector circuit of claim 1 wherein the phase detector is configured so as to be self-correcting, an active edge of the clock signal under a zero phase error condition thereby being substantially centered within a given bit of the data signal.

13. The phase detector circuit of claim 1 wherein said phase detector circuit is implemented as a component of an integrated circuit.

14. The phase detector circuit of claim 1 wherein said phase detector circuit is implemented as a component of a clock recovery circuit.

15. A clock recovery circuit comprising:

a phase detector circuit;

the phase detector circuit comprising:

first, second and third latches connected in series, each of the latches having a data input, a data output and a clock input, the data output of the first latch being coupled to the data input of the second latch, the data output of the second latch being coupled to the data input of the third latch;

reference signal generation circuitry having at least a first input coupled to the data output of the second latch and a second input coupled to the data output of the third latch, the reference signal generation circuitry being configured to generate an output corresponding to a reference signal; and error signal generation circuitry having at least a first input coupled to the data input of the first latch and a second input coupled to the data output of the second latch, the error signal generation circuitry being configured to generate an output that is indicative, relative to the reference signal, of phase error of a clock signal; and signal processing circuitry coupled to the phase detector circuit and configured to process the outputs of the reference signal generation circuitry and error signal generation circuitry to generate a signal having a characteristic which varies as a function of the phase error of the clock signal.

16. The clock recovery circuit of claim 15 wherein the signal processing circuitry further comprises:

first and second pulse width integrators coupled to respective error signal and reference signal outputs of the linear phase detector circuit; and a signal combiner having first and second inputs coupled to respective outputs of the pulse width integrators;

wherein the signal combiner generates as an output a signal having a voltage which varies as a function of the phase error of the clock signal.

17. An integrated circuit comprising a plurality of phase detector circuits, at least a given one of the phase detector circuits comprising:

first, second and third latches connected in series, each of the latches having a data input, a data output and a clock input, the data output of the first latch being coupled to the data input of the second latch, the data output of the second latch being coupled to the data input of the third latch;

reference signal generation circuitry having at least a first input coupled to the data output of the second latch and a second input coupled to the data output of the third latch, the reference signal generation circuitry being configured to generate an output corresponding to a reference signal; and error signal generation circuitry having at least a first input coupled to the data input of the first latch and a second input coupled to the data output of the second latch, the error signal generation circuitry being configured to generate an output that is indicative, relative to the reference signal, of phase error of a clock signal.

* * * * *